(12) United States Patent
Kanarik et al.

(10) Patent No.: US 8,492,174 B2
(45) Date of Patent: Jul. 23, 2013

(54) ETCH TOOL PROCESS INDICATOR METHOD AND APPARATUS

(75) Inventors: Keren Jacobs Kanarik, Sunnyvale, CA (US); Jorge Luque, Redwood City, CA (US); Nicholas Webb, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/481,588

(22) Filed: May 25, 2012

(65) Prior Publication Data

US 2012/0231556 A1    Sep. 13, 2012

Related U.S. Application Data

(60) Division of application No. 12/638,697, filed on Dec. 15, 2009, now Pat. No. 8,206,996, which is a continuation-in-part of application No. 11/392,356, filed on Mar. 28, 2006, now abandoned.

(51) Int. Cl.
*G01R 31/26* (2006.01)

(52) U.S. Cl.
USPC ..................................... 438/14; 257/E21.525

(58) Field of Classification Search
USPC ..................................... 438/14; 257/E21.525
See application file for complete search history.

(56) References Cited

U.S. PATENT DOCUMENTS

| | | | |
|---|---|---|---|
| 5,399,387 A | 3/1995 | Law et al. | |
| 5,746,513 A | 5/1998 | Renken | |
| 5,769,540 A | 6/1998 | Schietinger et al. | |
| 5,900,290 A | 5/1999 | Yang et al. | |
| 6,150,283 A | 11/2000 | Ishiguro | |
| 6,164,816 A | 12/2000 | Aderhold et al. | |
| 6,178,390 B1 | 1/2001 | June | |
| 6,200,023 B1 | 3/2001 | Tay et al. | |
| 6,211,094 B1 * | 4/2001 | Jun et al. | 438/758 |
| 6,319,732 B1 | 11/2001 | Dils et al. | |
| 6,410,351 B1 | 6/2002 | Bode et al. | |
| 6,417,014 B1 | 7/2002 | Lam et al. | |
| 6,441,351 B2 | 8/2002 | Hayasaki et al. | |
| 6,603,101 B2 | 8/2003 | Hayasaki et al. | |
| 6,622,104 B2 | 9/2003 | Wang et al. | |
| 6,689,519 B2 | 2/2004 | Brown et al. | |

(Continued)

FOREIGN PATENT DOCUMENTS

| | | |
|---|---|---|
| CN | 110197258 | 6/2008 |
| KR | 10-2004-0025945 | 3/2004 |
| WO | WO 98/32165 | 7/1998 |

OTHER PUBLICATIONS

U.S. Appl. No. 11/392,356, filed Mar. 28, 2006.

(Continued)

*Primary Examiner* — Matthew Landau
*Assistant Examiner* — Joseph C Nicely
(74) *Attorney, Agent, or Firm* — Beyer Law Group LLP (57) ABSTRACT

A method for providing a process indicator for an etching chamber is provided. A wafer with a blanket etch layer is provided into the etching chamber. A blanket etch is performed on the blanket etch layer. A blanket deposition layer is deposited over the blanket etch layer after performing the blanket etch has been completed. A thickness of the blanket etch layer and a thickness of the blanket deposition layer is measured. The measured thicknesses are used to determine a process indicator.

16 Claims, 7 Drawing Sheets

U.S. PATENT DOCUMENTS

| | | | |
|---|---|---|---|
| 6,733,594 B2 | 5/2004 | Nguyen | |
| 6,849,470 B1 | 2/2005 | Eriguchi et al. | |
| 6,850,322 B2 | 2/2005 | Campbell et al. | |
| 6,864,189 B2 | 3/2005 | Hayes et al. | |
| 6,876,442 B2 | 4/2005 | Vatus et al. | |
| 6,884,640 B2 | 4/2005 | Peterson et al. | |
| 6,960,416 B2 | 11/2005 | Mui et al. | |
| 7,082,345 B2 | 7/2006 | Shanmugasundram et al. | |
| 7,349,753 B2 | 3/2008 | Paik | |
| 7,361,607 B2 * | 4/2008 | Yamaguchi et al. | 438/709 |
| 7,634,325 B2 * | 12/2009 | Wang et al. | 700/121 |
| 8,053,256 B2 | 11/2011 | Howard et al. | |
| 2002/0001788 A1 | 1/2002 | Sakamoto et al. | |
| 2002/0022377 A1 | 2/2002 | Inada et al. | |
| 2002/0045146 A1 | 4/2002 | Wang et al. | |
| 2002/0069025 A1 | 6/2002 | Wang et al. | |
| 2002/0085212 A1 | 7/2002 | Campbell et al. | |
| 2003/0045960 A1 | 3/2003 | Yamamoto et al. | |
| 2003/0121905 A1 | 7/2003 | Manno et al. | |
| 2004/0173599 A1 | 9/2004 | Velichko et al. | |
| 2004/0185619 A1 | 9/2004 | Chung | |
| 2004/0206621 A1 | 10/2004 | Li et al. | |
| 2004/0222210 A1 | 11/2004 | Lin et al. | |
| 2005/0201894 A1 | 9/2005 | Suzuki et al. | |
| 2006/0027566 A1 | 2/2006 | Velichko et al. | |
| 2006/0068599 A1 | 3/2006 | Baek et al. | |
| 2006/0144335 A1 | 7/2006 | Lee et al. | |
| 2006/0169669 A1 | 8/2006 | Zojaji et al. | |
| 2006/0191637 A1 | 8/2006 | Zajac et al. | |
| 2006/0228818 A1 | 10/2006 | Chacin et al. | |
| 2006/0284720 A1 | 12/2006 | Bras | |
| 2006/0289504 A1 | 12/2006 | Hegedus | |
| 2007/0037301 A1 | 2/2007 | Jekauc | |
| 2007/0077770 A1 | 4/2007 | Wang et al. | |
| 2007/0161290 A1 | 7/2007 | Fitzsimmons et al. | |
| 2007/0260422 A1 | 11/2007 | Marcus et al. | |
| 2008/0025369 A1 | 1/2008 | Patel et al. | |
| 2008/0038927 A1 | 2/2008 | Yamaguchi et al. | |
| 2008/0124818 A1 | 5/2008 | Li et al. | |
| 2008/0153180 A1 | 6/2008 | Lansford et al. | |
| 2008/0223716 A1 | 9/2008 | Ockenfuss et al. | |
| 2009/0286332 A1 | 11/2009 | Ohta et al. | |
| 2009/0297784 A1 | 12/2009 | Xu et al. | |
| 2010/0022033 A1 | 1/2010 | Kanarik et al. | |

OTHER PUBLICATIONS

Office Action dated Mar. 11, 2008 from U.S. Appl. No. 11/392,356.
Final Office Action dated Aug. 19, 2008 from U.S. Appl. No. 11/392,356.
Office Action dated Nov. 11, 2008 from U.S. Appl. No. 11/392,356.
Final Office Action dated Apr. 29, 2009 from U.S. Appl. No. 11/392,356.
Office Action dated Aug. 6, 2009 from U.S. Appl. No. 11/392,356.
Notice of Allowance dated Feb. 29, 2012 from U.S. Appl. No. 12/638,697.
Office Action dated Jun. 23, 2010 from U.S. Appl. No. 12/571,947.
Final Office Action dated Dec. 8, 2010 from U.S. Appl. No. 12/571,947.
Notice of Allowance dated Jan. 26, 2011 from U.S. Appl. No. 12/571,947.

* cited by examiner

ETCH TOOL PROCESS INDICATOR METHOD AND APPARATUS

CROSS REFERENCE TO RELATED APPLICATIONS

This application is a divisional of and claims benefit to co-pending U.S. patent application Ser. No. 12/638,697 filed on Dec. 15, 2009, entitled "Etch Process Indicator Method and Apparatus," by Kanarik et al., which is a continuation-in-part of U.S. patent application Ser. No. 11/392,356 entitled "Process for Wafer Temperature Verification in Etch Tools," by Kanarik et al. filed Mar. 28, 2006, which are all hereby incorporated by reference for all purposes.

BACKGROUND OF THE INVENTION

The invention relates to the formation of semiconductor devices. More specifically, the invention relates to the providing process indicators for etch tools for the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. Thereafter, the wafer is etched to remove the underlying material from the areas that are no longer protected by the photoresist material, and thereby define the desired features in the wafer. Characteristics of features that are typically measured in semiconductor process are CD, etch rate, loading, profile, selectivity, bow, etc. There are many more "specs" that are important in fabrication. CD is an important parameter that is considered, in part because it defines the feature node.

Repeatability for different wafers processed in the same semiconductor processing device and between identical semiconductor processing devices, or even different types of semiconductor process device, is becoming one of the most pertinent issues in the semiconductor industry. Just etching the feature once is not enough, it must be reproducible across the entire wafer, and for every wafer on every tool all the time. Repeatability is important, because a large number, such as trillions, of transistor are etched on each wafer, where a large number of wafers are processed every day. Repeatability includes uniformity (within a wafer), wafer-to-wafer, lot-to-lot, chamber-to-chamber, over-time, even for process transfer between two chambers with different hardware. Achieving such uniform and consistent repeatability is a problem in the industry.

One method used to try to obtain such consistency is to try to get the tool as calibrated and identical as possible between tools or over time. The theory is that if the tool is identical, then the results will be identical. In practice, this helps, but doesn't fully address the problem. For example, a tool might be verified as calibrated, but if there is dirt on the chamber walls, or if a part is worn down, then the results are non-uniform. Blanket etch tests may be used to try to get an idea of how the plasma is working, but these blanket tests do not normally correlate to pattern wafer results, such as CD, which is very important to be able to predict. It is important to know if a chamber is ready to correctly etch an expensive patterned wafer, before the expensive patterned wafer is etched.

SUMMARY OF THE INVENTION

To achieve the foregoing and in accordance with the purpose of the present invention, a method for providing a process indicator for an etching chamber is provided. A wafer with a blanket etch layer is provided into the etching chamber. A blanket etch is performed on the blanket etch layer. A blanket deposition layer is deposited over the blanket etch layer after performing the blanket etch has been completed. A thickness of the blanket etch layer and a thickness of the blanket deposition layer is measured. The measured thicknesses are used as a process indicator.

In another manifestation of the invention a method for forming semiconductor features is provided. A wafer with a blanket etch layer is provided into the etching chamber. A blanket etch is performed on the blanket etch layer. A blanket deposition layer is deposited over the blanket etch layer after the performing the blanket etch has been completed. A thickness of the blanket etch layer and a thickness of the blanket deposition layer is measured. The measured thicknesses are used as a process indicator. The etch chamber is tuned if the process indicator is outside of a threshold. The previous steps are repeated until a processor indicator value is within the threshold. A patterned wafer is placed into the etching chamber after the process indicator value is within the threshold. The patterned wafer is etched to form semiconductor features.

In another manifestation of the invention a method for providing a process indicator for an etching chamber is provided. A first wafer with a blanket etch layer is placed into the etching chamber. A blanket etch is performed on the blanket etch layer. The first wafer is removed from the etching chamber. A second wafer is placed into the etch chamber. A blanket deposition layer is deposited over the second wafer. A thickness of the blanket etch layer of the first wafer is measured. A thickness of the blanket deposition layer of the second wafer is measured. The measured thicknesses are used to determine a process indicator.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the manufacture of semiconductor devices, it is desirable to maintain consistent CD, etch rates, and other etch parameters between different etch devices or for different time periods of the same etch device.

Figure 1:
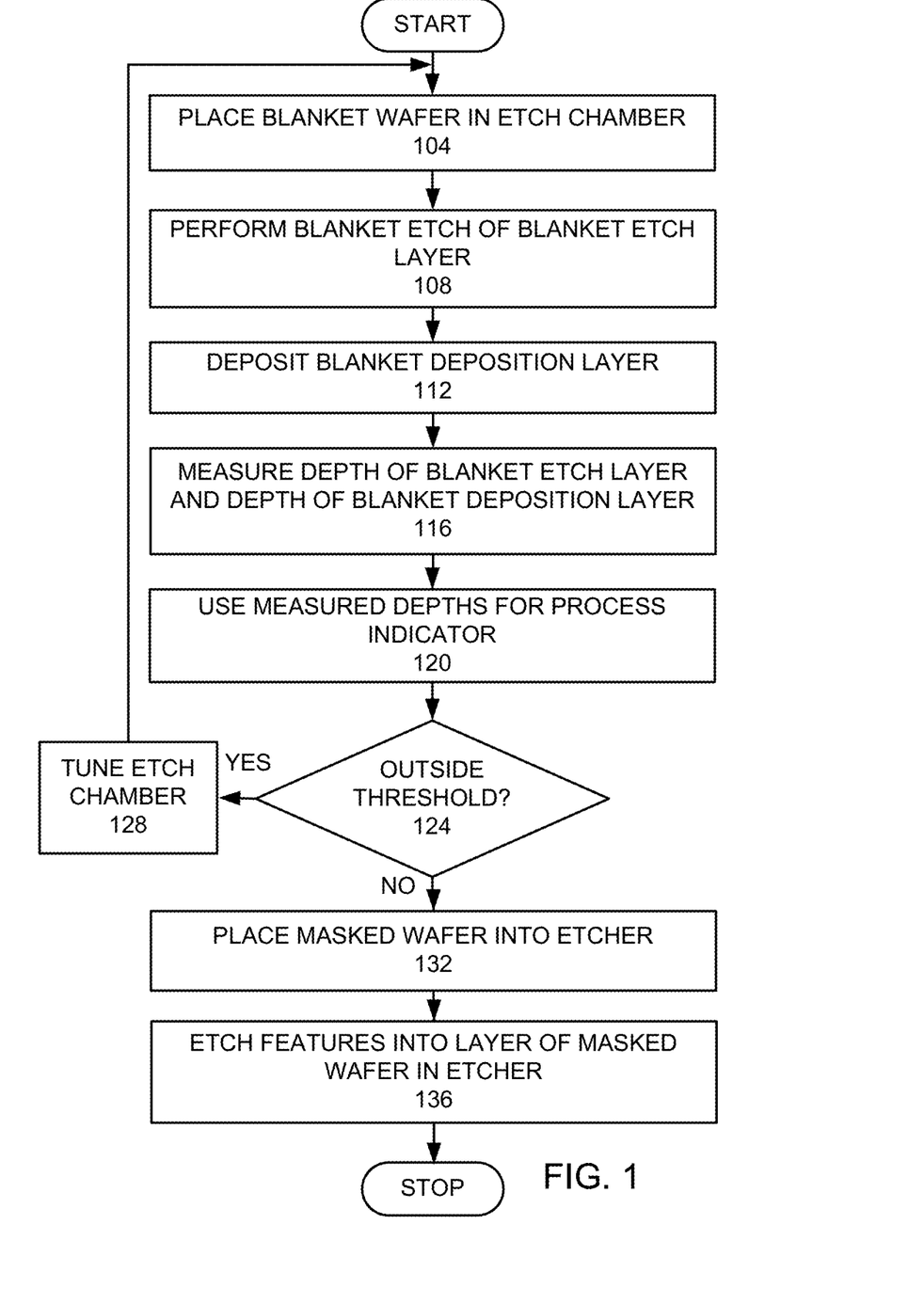
FIG. 1 is a high level flow chart of the formation of features in an etch layer used in an embodiment of the invention.
Figure 2A:
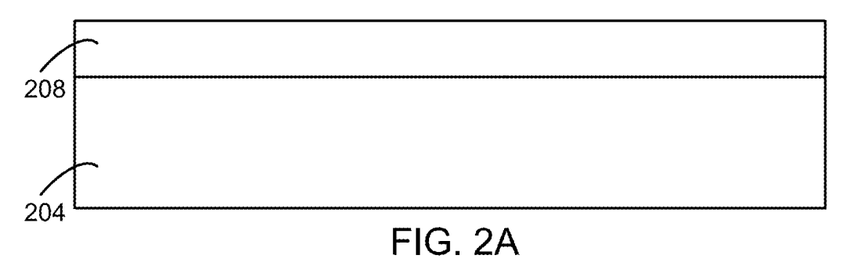
FIGS. 2A-C are schematic cross-sectional views of a blanket wafer used in a process, as shown in FIG. 1.

To facilitate understanding, FIG. 1 is a high level flow chart of a process used in an embodiment of the invention. A blanket wafer is placed in an etch chamber (step 104). FIG. 2A is a cross-sectional view of a blanket wafer 204 that is placed in an etch chamber. The blanket wafer 204 has a blanket etch layer 208, which is a uniform layer on a top wafer surface. The blanket etch layer 208 may be a silicon oxide layer formed over the surface of the wafer. Other embodiments would provide a blank silicon wafer with a blanket etch layer of any etchable material, such as silicon nitride, polysilicon, TiN, and organic compounds such as those found in PR mask materials. The blanket etch layer would preferably be a uniform layer over the wafer.

Figure 4:
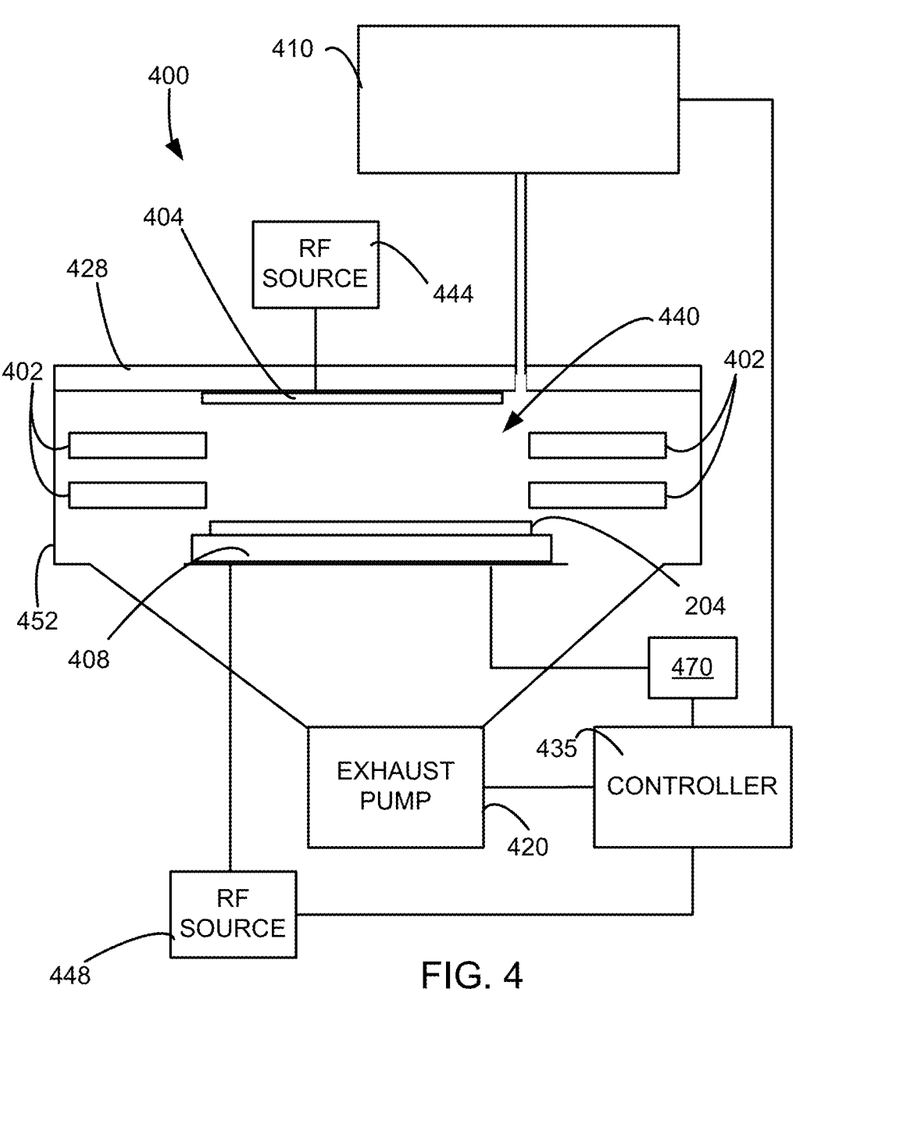
FIG. 4 is a schematic view of a plasma processing chamber that may be used for etching.

FIG. 4 is a schematic view of an etch chamber 400 that may be used in an embodiment of the invention. The etch chamber 400 comprises confinement rings 402, an upper electrode 404, a lower electrode 408, a gas source 410, and an exhaust pump 420. The gas source 410 may comprise an etch gas source and a deposition gas source. Within plasma processing chamber 400, the wafer 204 is positioned upon the lower electrode 408. The lower electrode 408 incorporates a suitable substrate chucking mechanism (e.g., electrostatic, mechanical clamping, or the like) for holding the wafer 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. Different combinations of connecting RF power to the electrode are possible. In a preferred embodiment of the invention, the 27 MHz, 60 MHz, and 2 MHz power sources make up the second RF power source 448 connected to the lower electrode, and the upper electrode is grounded. A temperature control device 470 is connected to the lower electrode 408 to control the temperature of the lower electrode. A controller 435 is controllably connected to the RF sources 444, 448, exhaust pump 420, the temperature control device 470, and the gas source 410. Such a device is capable of modulating the pressure of the chamber, gas flow, gas combinations, RF power, electrostatic chuck cooling, and time duration for each phase.

Figure 5A:
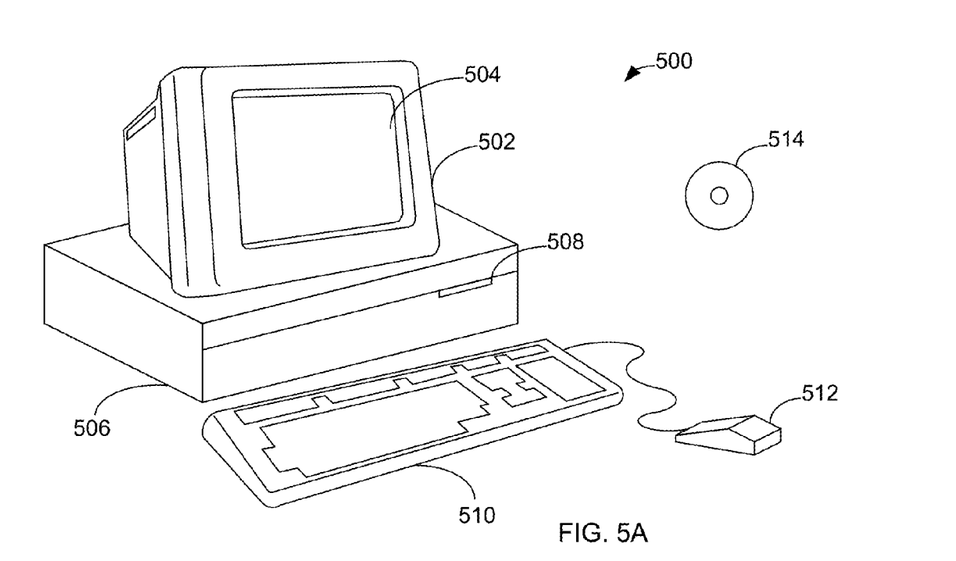
FIGS. 5A-B illustrate a computer system, which is suitable for implementing a controller used in embodiments of the present invention.
Figure 5B:
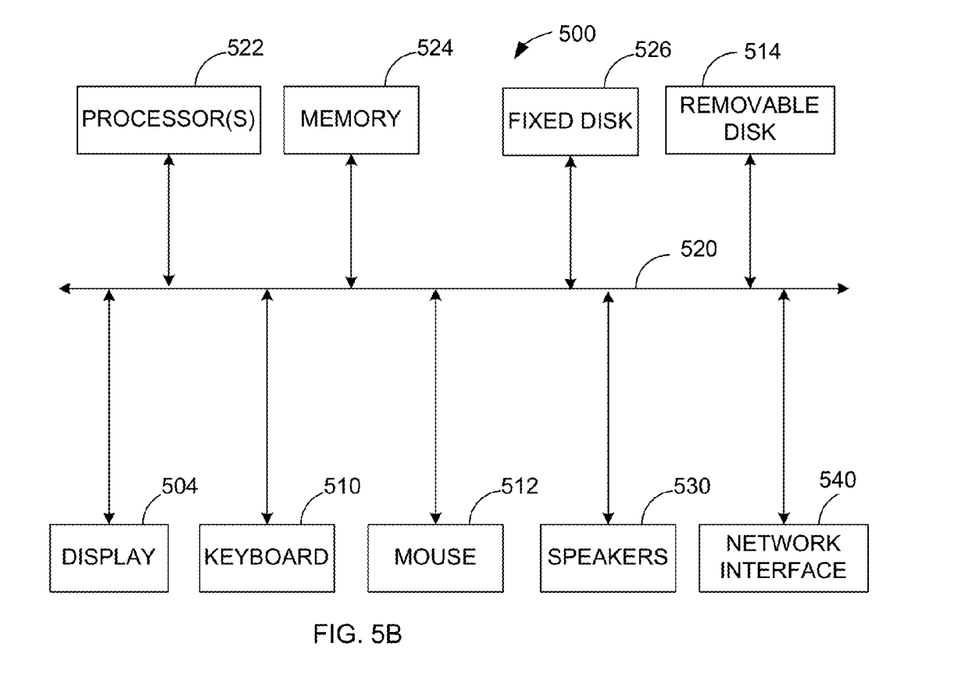

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
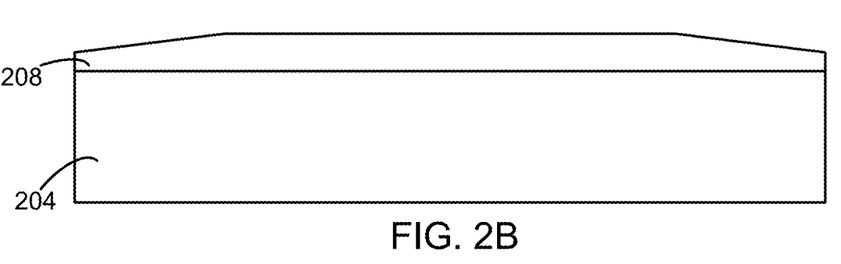

A blanket etch is performed by the etch chamber 400 on the blanket etch layer 208 (step 108). FIG. 2B is a cross sectional view of the wafer 204 with the blanket etch layer 208 after a blanket etch. In this example, the outer edge of the wafer is etched faster than the interior. In other embodiments, the outer edge may etch slower than the interior or both regions may etch at about the same rate or other profiles may be formed.

An example of a blanket etch would provide a flow of an etchant gas of 200 sccm of $CF_4$. An RF power of 800 watts at 27 MHz is provided to energize the etchant gas. The pressure is maintained at 50 mTorr. The resulting plasma is maintained for 120 s.

Figure 2C:
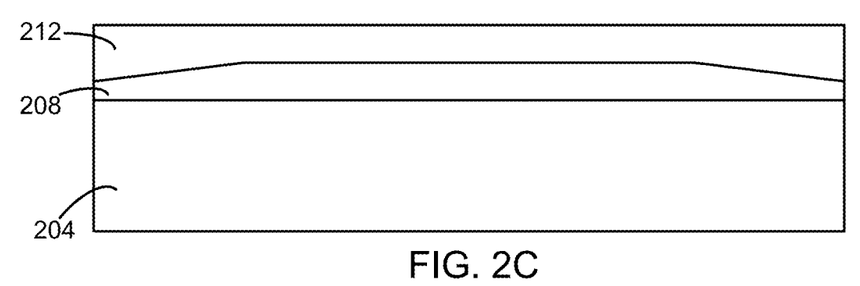

A blanket deposition layer is deposited over the blanket etch layer (step 112). FIG. 2C is a cross sectional view of the wafer 204 with the blanket etch layer 208 after a blanket deposition layer 212 has been deposited.

An example recipe for depositing the layer over the wafer is as follows: A deposition etch phase gas of 18 sccm of $C_4F_8$ and 300 sccm of Ar is provided. A cooling system through the electrostatic chuck is set to keep the electrostatic chuck at a temperature of 20° C. The chamber pressure was set to 180 mTorr. 300 W were provided by the 27 MHz RF source and 300 W were provided by the 2 MHz power source. In this example, the deposition is provided for 120 seconds. Such a recipe forms a polymer layer over the wafer.

The thickness of the blanket etch layer 208 and the thickness of the blanket deposition layer 212 are then measured (step 116). An ellipsometer made and sold by KLA-Tencor Corporation™ is a device that may be used to measure the thickness of the blanket etch layer 208 and the thickness of the blanket deposition layer 212. A two-oscillator model provides enough differentiation to silicon oxide optical functions to measure both a polymer layer thickness and an underlying silicon oxide layer thickness over a silicon wafer. Other devices and methods may be used to measure the thickness of the blanket etch layer 208 and the thickness of the blanket deposition layer 212. Generally, such measurement devices require that the wafer is removed from the etch chamber and placed in the measurement tool before the thickness of the blanket etch layer 208 and the thickness of the blanket deposition layer 212 are measured. The thickness of the blanket etch layer 208 and the thickness of the blanket deposition layer 212 may be measured at one location on the wafer or at a plurality of different locations on the wafer. In a preferred embodiment a wafer would be measured in at least 49 places around the wafer.

The thickness of the blanket etch layer 208 and the thickness of the blanket deposition layer 212 are used for determine a process indicator (step 120). Various methods may be used to determine the process indicator. In one example, a measured thickness of the blanket etch layer 208 and the thickness of the blanket deposition layer 212 may be compared with a standard measured thickness of the blanket etch layer and the thickness of the blanket deposition layer. Differences in uniformity across the wafer will give a lot of information about both the state of the chamber (i.e. if it is ready to process patterned wafers) and if there are faults. For example, if a bolt was not tightened correctly on one side of the chamber, this might show up on that side of the chamber only.

In this example, a determination is made of whether the process indicator is outside of the threshold (step 124). If the process indicator is outside a threshold, it may be used to determine an etch chamber fault. More complicated algorithms may be used to compare thicknesses for determining the process indicator. In this example, if the process indicator is outside of a threshold, the etch chamber is tuned (step 128) according to the process indicator and the process goes back to step 104, where a new blanket wafer is placed in the etch chamber.

Figure 3A:
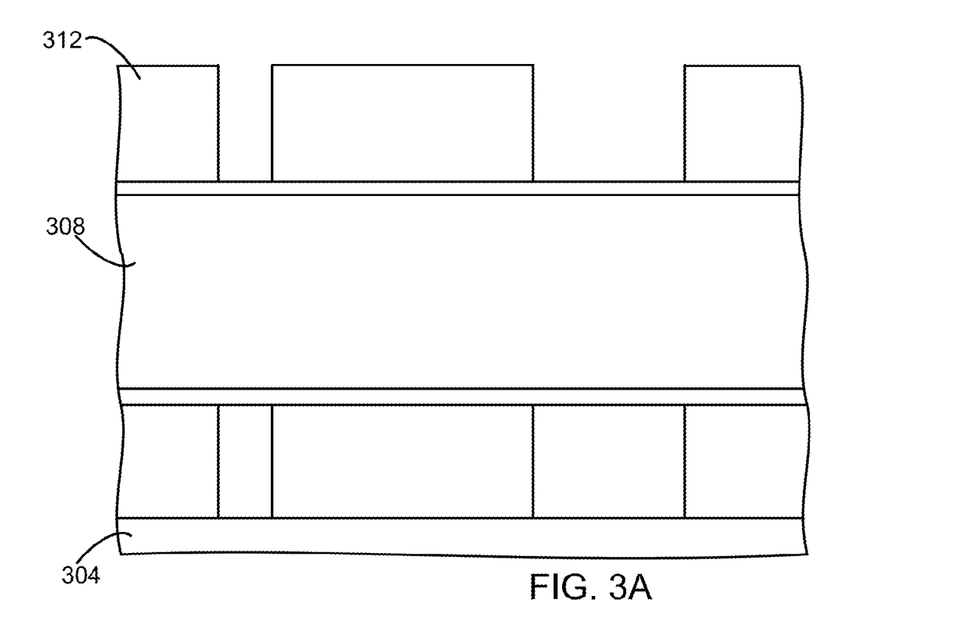
FIGS. 3A-B are schematic cross-sectional views of a masked wafer used in a process, as shown in FIG. 1.
Figure 3B:
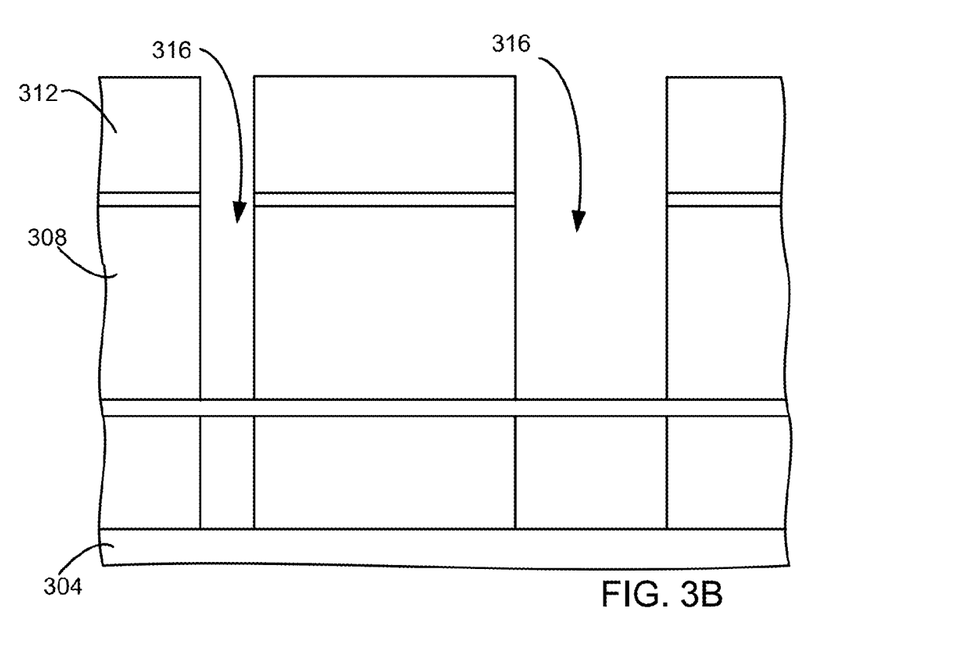

If the process indicator is not outside the threshold, then the etch chamber is sufficiently in tune and ready for processing. A masked wafer is then placed into the etcher (step 132). FIG. 3A is a cross sectional view of a wafer 304, over which an etch layer 308 is disposed, over which an etch mask 312 is disposed. Various numbers of intermittent layers may be disposed between the wafer 304, the etch layer 308, and the etch mask 312. Features 316 are etched into the etch layer 308 through the etch mask 312 in the etcher (step 136), as shown in FIG. 3B.

In one example if a system uses five etchers in parallel, the inventive process may be used in each etcher. The inventive process may be used to tune each of the five etchers to a standard before the etchers are used to provide a patterned etch. The tuning would cause the five etchers to provide more uniform devices. Here uniformity is defined as providing uniform results between the different devices, which may use different or the same processes.

In the specification and claims tuning is defined as changing a recipe or changing the etch chamber. The goal of tuning is to improve the process indicator.

The etch chamber may be any etch chamber, such as a dielectric etch chamber for etching dielectric layers or a conductive etch chamber for etching conductive layers or a silicon layer. Preferably, the etch chamber is a dielectric etch chamber. In another embodiment the etch chamber is a conductor etch chamber that uses another etch and deposition recipes.

One embodiment of the invention is that the invention provides a method of tuning different types of etch chambers. For example a standard dielectric etcher from Lam Research Corp. of Fremont, Calif. may be tuned to an upgraded dielectric etcher from Lam Research Corp. to allow the different etches to provide uniform etching.

In another embodiment, the invention is used for the same etch chamber periodically, such as after each chamber clean or whenever the chamber is opened for any reason. Over time, etch chambers become out of tune, or after certain events, such as a cleaning process, a chamber may need to be retuned. Becoming out of tune can also occur whether or not the chamber is opened periodically. For example, after many RF hours, the thickness of certain parts might change and their electrical properties would change, so that the etch chambers no longer work the same as they used to. The inventive process provides testing and tuning when an etcher becomes out of tune. Tuning the same chamber over time or tuning nearly identical chambers together is called "chamber matching." The chamber matching may match tool to tool, site to site, or lot to lot.

The determination of whether there is chamber matching or whether a chamber and various subsystems are properly working, i.e. whether the output power is working, and whether they are properly calibrated is being called "process calibration." A process indicator provides an indication for fault detection or process calibration.

CD is very highly sensitive to the amount of deposition in the process, because it is on a sidewall the ion effects have much less influence. The normal etch test does not measure deposition very well because it is etching, but the deposition test measures it directly and so is a much better indicator of CD. On the other hand, an etch test is a better indicator for feature properties that can be highly dependent on ions (vertical etching), such as etch rate. Thus the two layers are very complementary to each other for measuring both deposition and etch properties.

Figure 6:
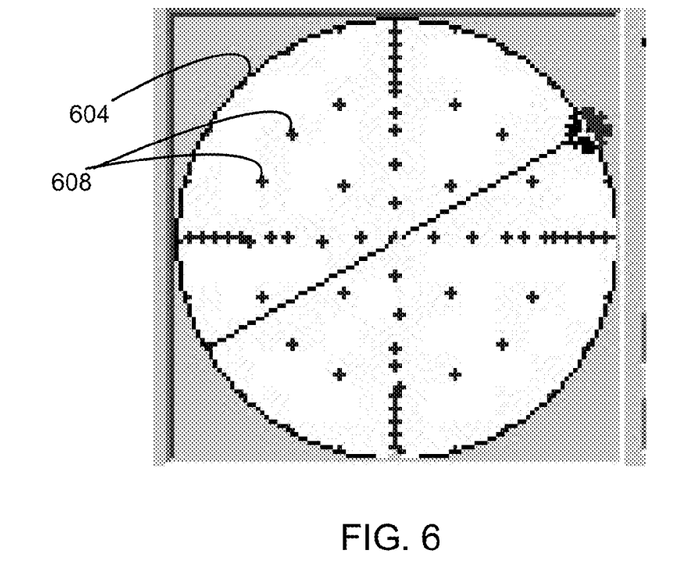
FIG. 6 is a top schematic view of a wafer with a test pattern with forty-nine polar plot points and additional diagonal plot points.

In one embodiment, a single location is used to measure the thickness of the blanket etch layer and the thickness of the blanket deposition layer. In another embodiment, the thickness of the blanket etch layer and the thickness of the blanket deposition layer are measured in at least 49 locations. FIG. 6 is a top schematic view of a wafer 604. Forty-nine polar plot points 608 and additional diagonal plot points are designated for the wafer to form a test pattern.

Figure 7:
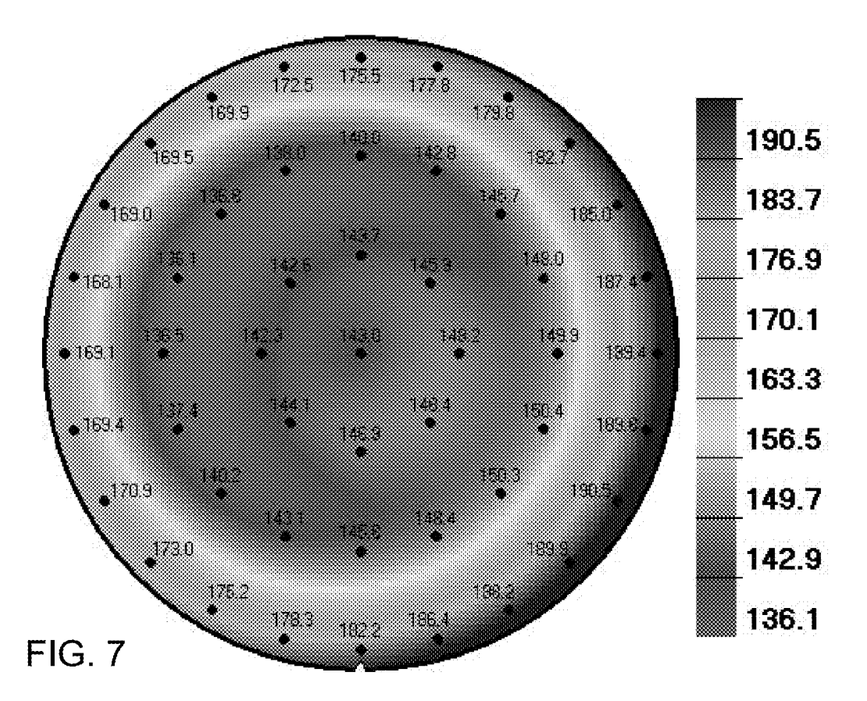
FIG. 7 is an image for the inventive blanket etch showing just the deposition layer of the bilayer test results.
Figure 8:
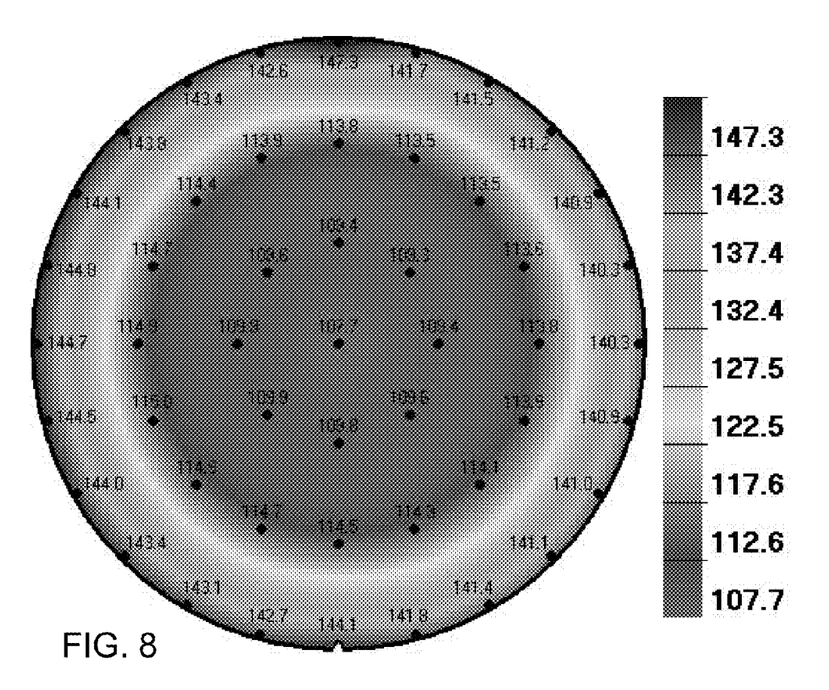
FIG. 8 is an image for the inventive blanket etch showing just the etched layer of the bilayer test results.
Figure 9:
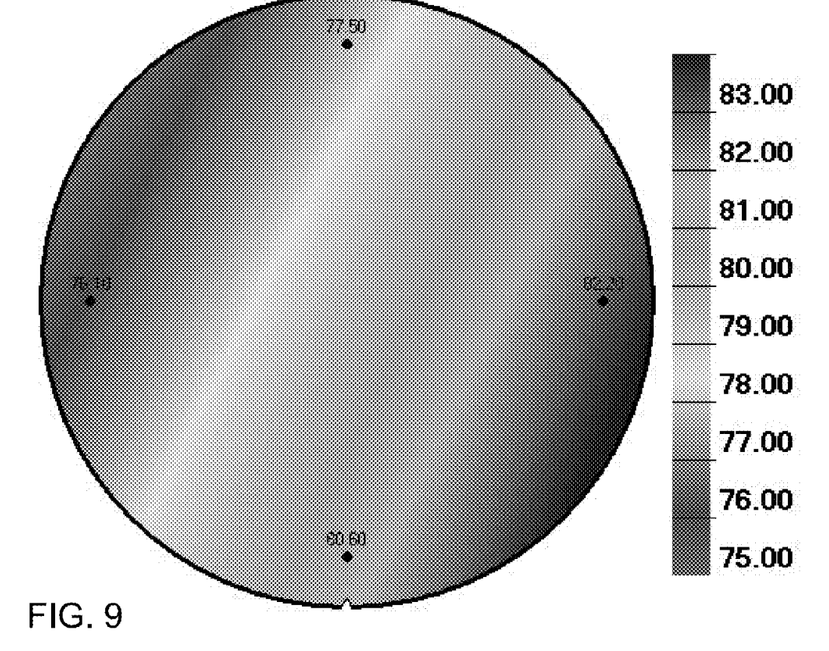
FIG. 9 is an upper electrode temperature map.

FIG. 7 is an image of test results measuring a process indicator using a forty-nine polar plot point test pattern for the inventive blanket deposition layer. As can be seen, the resulting process indicator is radially asymmetric. FIG. 8 is an image of test results measuring a process indicator using a forty-nine polar plot point test pattern for the inventive blanket etch layer. As can be seen, this layer of the process indicator is radially symmetric. The combination of finding the inventive blanket deposition layer being asymmetric combined with the inventive blanket etch layer being symmetric points to a particular problem with the chamber. FIG. 9 is an upper electrode temperature map. This map indicates that, in this particular case, the upper electrode temperature is asymmetric. The asymmetry of the upper electrode temperature affects the CD uniformity of a patterned wafer. A conventional single layer test, which would use only a blanket etch would have resulted in a symmetrical etch, such as shown in FIG. 8, which would not have picked up the asymmetry problem before the expensive wafers were processed. The use of both a blanket etch and blanket deposition in the invention provides a better indicator, which would detect such asymmetries.

In another embodiment of the invention, the measurement of a plurality of thicknesses at different locations provides spatial information regarding uniformity, which may provide a spatial map. This may indicate whether the inner and outer parts of the wafer has different etch rates or if there are non symmetrical results.

In another embodiment, the measurement of a plurality of thicknesses at different locations may be taken, where the measurements at the different locations are then averaged to obtain average thicknesses. The averaging, obtaining a median or mode, or other operations may be used to combine a plurality of thicknesses to obtain a combined thicknesses number, which may be used for determining the process indicator. The use of a single number, such as the combined thicknesses number for determining the process indicator provides a fast comparison process.

The invention provides a process indicator test that uses readily available material and is cheap, fast, and accurate. Tests that require a patterned wafer will not work, because they do not meet these criteria.

Another embodiment of the invention can be used to "scan" process regimes. For example, in a process that provides etched wafers with CDs that are not uniform and it is desirable to know which process regime has more uniform conditions, an embodiment of the invention may be used to scan through a large amount of process regimes much faster and cheaper than using a pattern wafer.

Other embodiments of the invention are used in place of other tests that require a patterned wafer for any reason, where these embodiment provide a cheaper (i.e. blanket) wafer can be used instead of a more expensive wafer (i.e. the pattern wafer).

In another embodiment a blanket deposition may be done on one wafer and a blanket etch may be performed on another blanket wafer. The measured results of both wafers may be combined and used as a process indicator.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing a process indicator for an etching chamber, comprising:
   a) providing a first wafer with a blanket etch layer into the etching chamber;
   b) performing a blanket etch of the blanket etch layer;
   c) removing the first wafer from the etching chamber;
   d) providing a second wafer into the etch chamber;
   e) depositing a blanket deposition layer over the second wafer in the etch chamber;
   f) measuring a thickness of the blanket etch layer of the first wafer after the blanket etch;
   g) measuring a thickness of the blanket deposition layer of the second wafer; and
   h) using the measured thicknesses to determine a process indicator.

2. The method, as recited in claim 1, wherein the using the measured thicknesses to determine a process indicator provides combining a plurality of thicknesses to obtain a combined thicknesses number.

3. The method, as recited in claim 1, wherein the measuring the thickness of the blanket etch layer of the first wafer and the thickness of the blanket deposition layer of the second wafer measures a plurality of thicknesses at a plurality of different locations, and wherein using the measured thicknesses, comprises providing a spatial map from the measured plurality of thicknesses at the plurality of different locations.

4. The method, as recited in claim 3, wherein the using the measured thicknesses to determine a process indicator compares the measured thicknesses to a standard, and further comprising tuning the etch chamber and repeating steps a-e until a processor indicator value is within a threshold.

5. The method, as recited in claim 4, wherein the tuning increases spatial symmetry of the measured thicknesses.

6. The method, as recited in claim 5, further comprising:
   providing a patterned wafer into the etching chamber after the process indicator value is within the threshold; and
   etching the patterned wafer.

7. The method, as recited in claim 6, wherein the standard is generated from measured thicknesses of a device different from the etching chamber.

8. The method, as recited in claim 6, wherein the blanket etch layer is a silicon oxide layer.

9. The method, as recited in claim 3, wherein the plurality of thicknesses at a plurality of different locations is at least 49 thicknesses from at least 49 different locations.

10. The method, as recited in claim 3, wherein the process indicator provides fault detection.

11. The method, as recited in claim 3, wherein the process indicator provides process calibration.

12. The method, as recited in claim 1, wherein the using the measured thicknesses to determine a process indicator compares the measured thicknesses to a standard, and further comprising tuning the etch chamber and repeating steps a-e until a process indicator value is within a threshold.

13. The method, as recited in claim 12, wherein the tuning increases spatial symmetry of the measured thicknesses.

14. The method, as recited in claim 13, further comprising:
providing a patterned wafer into the etching chamber after the process indicator value is within the threshold; and
etching the patterned wafer.

15. The method, as recited in claim 14, wherein the standard is generated from measured thicknesses of another etching chamber.

16. The method, as recited in claim 14, wherein the blanket etch layer is a silicon oxide layer.

* * * * *